United States Patent [19]
Chao

[11] Patent Number: 4,818,715
[45] Date of Patent: Apr. 4, 1989

[54] METHOD OF FABRICATING A LDDFET WITH SELF-ALIGNED SILICIDE

[75] Inventor: Fung-Ching Chao, Tainan Shih, Taiwan

[73] Assignee: Industrial Technology Research Institute, China

[21] Appl. No.: 72,186

[22] Filed: Jul. 9, 1987

[51] Int. Cl.⁴ .......................................... H01L 21/265
[52] U.S. Cl. ....................... 437/44; 437/228; 437/229; 437/233; 437/186; 357/23.3; 156/643
[58] Field of Search .............. 156/643, 651, 652, 653, 156/650; 437/41, 44, 233, 235, 238, 241, 243, 154; 357/596, 23.3, 23.4, 23.9, 23.11, 91; 148/DIG. 122, DIG. 106, DIG. 82, DIG. 83

[56] References Cited
U.S. PATENT DOCUMENTS

| 4,101,922 | 7/1978 | Tihanyi et al. | 357/23.4 |
| 4,190,850 | 2/1980 | Tihanyi | 357/23.4 |
| 4,247,860 | 1/1981 | Tihanyi | 357/23.12 |
| 4,382,826 | 5/1983 | Pfleiderer et al. | 437/44 |
| 4,613,883 | 9/1986 | Tihanyi | 357/596 |

FOREIGN PATENT DOCUMENTS

| 0054577 | 4/1979 | Japan | 156/643 |
| 0161282 | 12/1979 | Japan | 357/23.9 |
| 0064973 | 4/1982 | Japan | . |
| 0083061 | 5/1982 | Japan | 437/44 |
| 0055665 | 3/1985 | Japan | 437/44 |

OTHER PUBLICATIONS

Tihanyi et al., "DIMOS—A Novel IC Technology with Submicron Effective Channel MOSFETS", IEDM, 1977, pp. 399-401.
Ohta et al., "A Quadruply Self-Aligned MOS (QSA MOS), A New Short Channel High Speed High Density MOSFET for VLSI", IEDM, 1979, pp. 581-583.
Huang et al., "A Novel Submicron LDD Transistor with Inverse T-Gate Structure", IEDM, 1986, pp. 742-745.

Primary Examiner—Brian E. Hearn
Assistant Examiner—M. Wilczewski
Attorney, Agent, or Firm—Bert J. Lewen; Henry Sternberg

[57] ABSTRACT

A method of fabricating a lightly-doped drain field effect transistor (LDDFET) with or without self-aligned silicide (salicide) on a substrate is disclosed. The initial steps include either (1) anisotropic silicon nitride and polysilicon etching steps, an isotropic photoresist erosion step, and a second anisotropic etching of part of the silicon nitride to obtain a ladder-shaped polysilicon gate having a silicon nitride thereon; or (2) an anisotropic polysilicon etch step, an isotropic photoresist erosion step to expose part of the unetched polysilicon, and a second anisotropic polysilicon etch step to remove completely the unmasked polysilicon to obtain the ladder-shaped polysilicon gate. The LDD structure is formed by the implantation of ions to form a heavily-doped source and drain regions and lightly-doped regions under the step of the ladder-shaped polysilicon gate layer. Thereafter, the thin polysilicon step is oxidized completely. After the silicon nitride and silicon dioxide layers are removed, the self-aligned silicide may be applied to form the LDD with salicide.

38 Claims, 14 Drawing Sheets

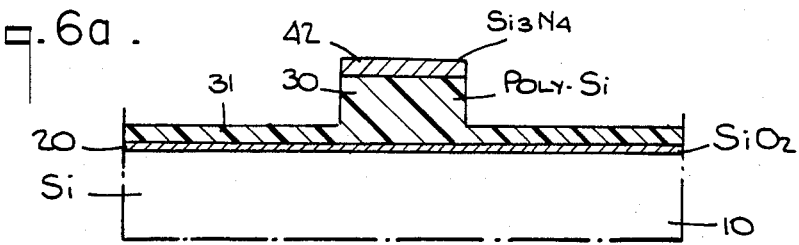
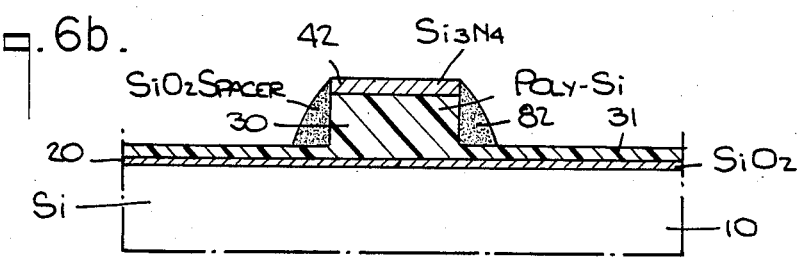
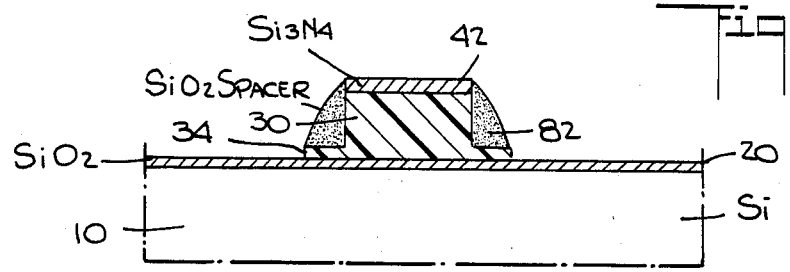
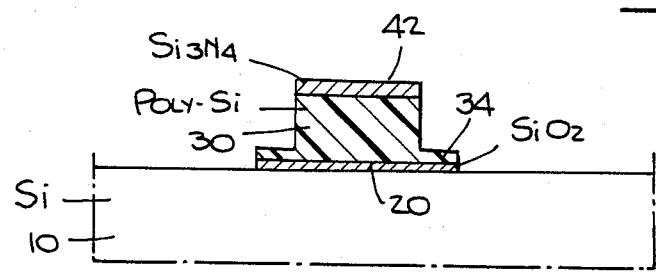

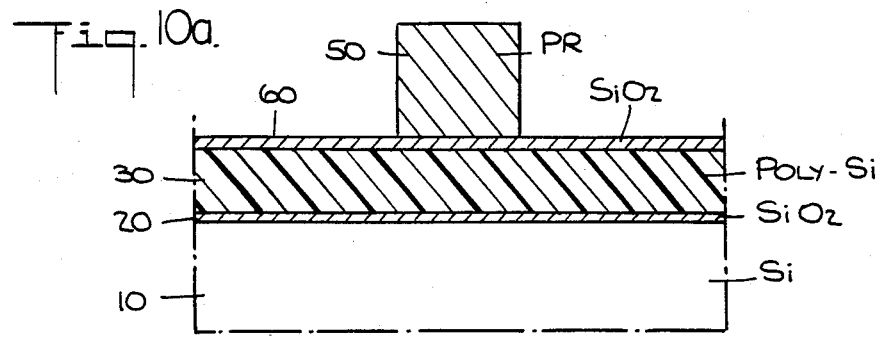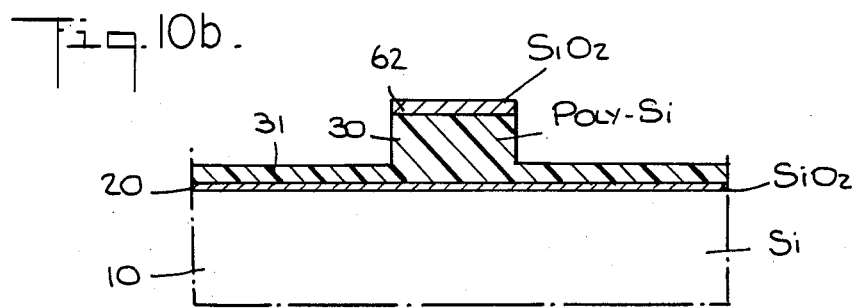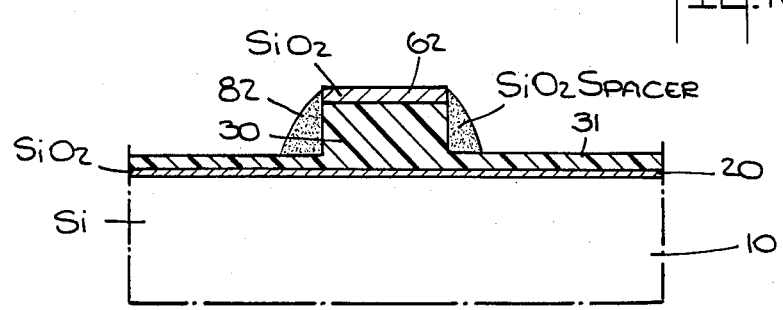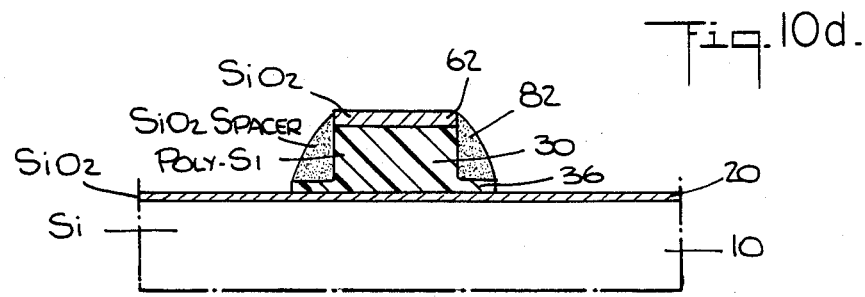

METHOD OF FABRICATING A LDDFET WITH SELF-ALIGNED SILICIDE

BACKGROUND OF THE INVENTION

In order to achieve high circuit performance and density, MOSFET (metal-oxide-semiconductor field effect transistor) devices in silicon integrated circuit technology are scaled down to submicrometer range. In scaling down MOSFETs, the reduction of device dimensions is not accompanied by a corresponding reduction in power requirements. As a result, NMOS (n-channel MOS) devices are susceptible to channel hot-electron (CHE) instability. See Chenming Hu et al., "Hot-Electron-Induced MOSFET Degradation—Model, Monitor and Improvement," *IEEE Transactions on Electron Devices*, Vol. ED-32, No. 2 (February 1985), pp. 375-385. The instability is caused by the very high electric field near the drain junction resulting from the short channel length and high supply voltage.

Another difficulty caused by scaling down is the increase in the resistance of diffused layers. This results in increased signal delays along diffused interconnects and degrades circuit performance due to the large source/drain series resistance.

To alleviate the high electric field at the reduced MOSFET channel length, lightly doped drain (LDD) devices have been proposed. See K. Saito et al, "A New Short Channel MOSFET with Lightly Doped Drain," *Denshi Tsushin Rengo Taikai* (in Japanese) (April 1978), p. 220. In the LDD structure, narrow, self-aligned, n− regions are introduced between the channel and the n+ source/drain regions. The n− region spreads the high electric field out near the drain junction, allowing the device to be operated at a higher supply voltage with fewer hot-electron problems.

Several processes for fabricating lightly-doped drain field effect transistor (LDDFET) have been proposed. Spacer and overhang techniques are most commonly adopted. The spacer technique involves a reactive-ion etching (RIE) step after silicon dioxide is chemically vapor deposited to form side wall oxide spacers. Oxide spacers are used to mask the heavy and deep implant of the n+ drain/source regions after the formation of the shallow n− drain/source regions. See FIG. 2, p. 590, of Paul J. Tsang et al., "Fabrication of High-Performance LDDFET's with Oxide Sidewall-Spacer Technology," *IEEE Transactions on Electron Devices*, Vol. ED-29, No. 4 (April 1982). The overhang technique involves a polysilicon over-etching step after $SiO_2/Si_3N_4$/poly-Si/$SiO_2$ gate stack is patterned to form $SiO_2/Si_3N_4$ overhangs. $SiO_2/Si_3N_4$ overhangs are used to mask the heavy and deep implant of the n+ drain/source regions followed by the formation of the shallow n− drain/source regions. See FIG. 2, p. 1360, of Seiki Ogura et al., "Design and Characteristics of the Lightly Doped Drain-Source (LDD) Insulated Gate Field-Effect Transistor," *IEEE Transactions on Electron Devices*, Vol. ED-27, No. 8 (August 1980).

Two alternative structures, buried LDD and graded/buried LDD structures, adopting sidewall oxide spacer technology, have also been demonstrated. See Ching-Yeu Wei et al., "Buried and Graded/Buried LDD Structures for Improved Hot-Electron Reliability," *IEEE Electron Device Letters*, Vol. EDL-7, No. 6 (June 1986), pp. 380-382. In the spacer technology, additional oxide deposition and oxide etch-back processes are needed. In the overhang technology, additional $Si_3N_4/SiO_2$ deposition and polysilicon over-etching processes are required. In addition, two ion implantation steps are necessary and, therefore, these two processes are far too complicated for commercial application.

Still another method described is the so-called self-defined polysilicon sidewall (SEPOS) technique which uses $SiO_2$ at the vertical sides of the polysilicon to define the oxide-framed polysilicon sidewall. See FIG. 1, p. 2463, of M. Saitoh, "Degradation Mechanism of Lightly Doped Drain (LDD) n-Channel MOSFET's Studied by Ultraviolet Light Irradiation," *J. Electrochem. Soc.: Solid-State Science and Technology*, Vol. 132, No. 10 (October 1985), pp. 2463-2466.

Also proposed has been the self-aligned polysilicon source/drain (SAPSD) technique which uses a n+ polysilicon source/drain layer to allow the dopants to diffuse into the substrate to form the n− region. See FIG. 1, p. 314, of Tiao-Yuan Huang et al., "A MOS Transistor with Self-Aligned Polysilicon Source-Drain," *IEEE Electron Device Letters*, Vol. EDL-7, No. 5 (May 1986), pp. 314-316.

The inverse-T LDD (ITLDD) transistor has also been proposed. This transistor uses a sidewall oxide spacer to define the n− region. See FIG. 2, page 743, of Tiao-Yuan Huang et al., "A Novel Submicron LDD Transistor with Inverse-T Gate Structure," *IEDM 86* (International Electron and Device Meeting 1986), Sec. 31.7, pp. 742-745. Unfortunately, all of these techniques are too difficult because of the complexity of the processes.

In addition, a new LDD structure for NMOS FET has also been demonstrated. It may be made using a single ion implantation step to form n− regions due to the sloped sidewall of the structure. See FIG. 1, p. 28, of "A New Structure LDD for NMOSFET," *Japan Semiconductor News*, Vol. 3, No. 3 (June 1984), pp. 27-28. Unfortunately, the gate of the FET is much higher than source/drain regions.

To overcome the series resistance problem, self-aligned silicide (salicide) technology has been proposed. This approach reduces device series resistance and enhances interconnects. See C. M. Osburn et al., "High Conductivity Diffusions and Gate Regions using Self-Aligned Silicide Technology," *Electrochemical Society Proceedings*, First International Symposium VLSI Science and Technology, Vol. 82—7 (1982), pp. 213-223. In salicide technology, a gate sidewall oxide is formed which protects the gate sidewall from shorting to the source/drain regions after salicidation.

Combining LDD with salicide technologies has been reported. See FIG. 6, p. 347, of Fang-Shi J. Lai et al., "Design and Characteristics of a Lightly Doped Drain (LDD) Device Fabricated with Self-Aligned Titanium Disilicide," *IEEE Transactions on Electron Devices*, Vol. ED-33, No. 3 (March 1986), pp. 345-353. However, the fabrication of the LDDFET requires additional depositing and etching of chemical vapor deposited films and two ion implantation steps. Accordingly, the process is far too complicated.

SUMMARY OF THE PRESENT INVENTION

The present invention relates to a technique of fabricating a lightly-doped drain field effect transistor (LDDFET) using a single ion-implantation with or without self-aligned silicide (salicide).

A high quality silicon dioxide layer is thermally grown on a silicon wafer, and a polysilicon layer is then deposited over the thermal oxide layer. A n+ diffusion step is performed to dope the polysilicon layer and a silicon nitride layer is deposited thereon. The photoresist mask having a polysilicon gate pattern is then applied using conventional photoresist coating and optical lithography techniques.

In a first technique of the invention, a first dry etching step is performed in which silicon nitride is removed completely and polysilicon is anisotropically etched to a proper thickness. Then the photoresist masking layer is isotropically etched (eroded) to expose part of the unetched silicon nitride layer; and a second dry etching step is performed to remove silicon nitride and polysilicon layers until all of the remaining polysilicon on source and drain regions are removed.

In the second technique of the invention, a portion of the unmasked polysilicon is anisotropically etched to a predetermined thickness. Then the photoresist masking layer is isotropically etched to expose part of the unetched polysilicon, and a second partial etch of the newly unmasked polysilicon performed until all of the remaining polysilicon on the source and drain regions is removed.

These steps complete the formation of the ladder polysilicon gate. When the first technique is used, the gate has silicon nitride on top of it.

After the photoresist masking layer is stripped, a heavy n-type ion implantation process is performed to achieve source/drain regions and lightly-doped source/drain regions at the same time. An oxidation process is then followed to oxidize the thin polysilicon steps completely. The silicon nitride layer and silicon dioxide layers on the source/drain regions are removed, leaving the polysilicon dioxide around the sidewall of the polysilicon gate. Thereafter, a thin layer of metal is deposited to form metal silicide at both polysilicon gate and source/drain regions. A selective etchant is then used to remove the unreacted metal, but not the metal silicides, to form the LDDFET with salicide.

DESCRIPTION OF THE DRAWINGS

The two basic techniques of the invention are illustrated and described in a series of eight embodiments. The first four embodiments show the process wherein a silicon nitride layer is deposited on the polysilicon layer during processing. In contrast, the second four embodiments show the second technique wherein the polysilicon is etched without any covering or with a silicon dioxide covering. For each technique, the examples of the photoresist erosion technology and spacer technology are illustrated for a single step LDD and a two step LDD.

FIG. 1 shows the structure after the initial coating steps wherein the silicon wafer is first coated with a thin, thermally-coated silicon dioxide layer, a n-doped polysilicon layer, and a silicon nitride layer having on top of it a defined photoresist mask layer with the gate pattern.

FIG. A-4 shows the structure after the anisotropic etch of the silicon nitride layer and the portion of the polysilicon layer outside the gate region.

FIG. A-5 illustrates the structure after the removal of the photoresist masking layer. The ladder polysilicon gate with silicon nitride is shown.

FIG. A-6 shows the implantation of the heavy dose of ions and the lightly doped source and drain regions.

FIG. A-7 shows the structure resulting from the oxidation of the thin polysilicon steps illustrating the formation of the sidewall polysilicon dioxide spacers.

FIG. A-8 shows the structure after the removal of the silicon nitride layer.

FIG. A-9 shows the structure after the removal of the silicon dioxide layers from the source/drain regions.

FIG. A-10 illustrates the LDDFET with the salicides formed over the gate and source/drain regions.

Figure 1:
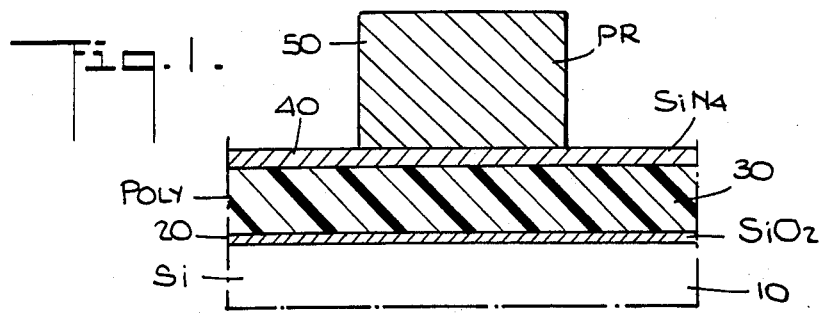
FIGS. 1 to A-10 show transverse sectional views of the structure formed at various stages in the fabrication of the LDDFET in accordance with a first embodiment of the invention.
Figure 2:
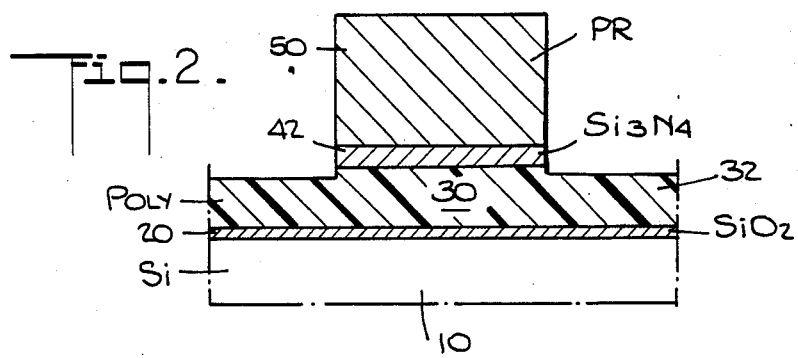
FIG. 2 shows the structure after the anisotropic etch of the silicon nitride layer and a part of the polysilicon layer.
Figure 3:
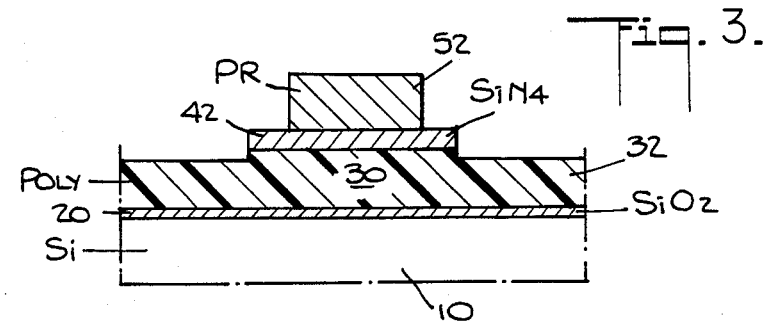
FIG. 3 shows the structure after the isotropic etch of part of the photoresist masking layer showing selected portions of the unetched silicon nitride layer exposed.
Figure 4A:
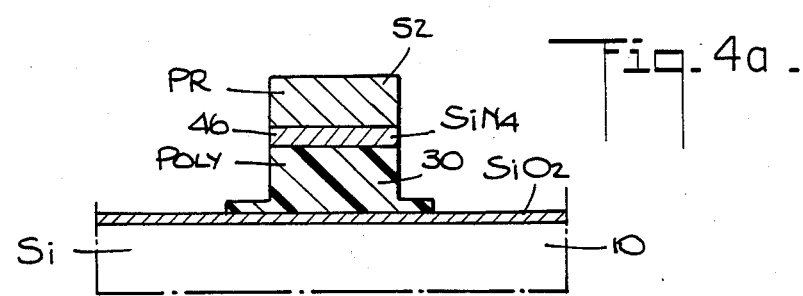
Figure 4B:
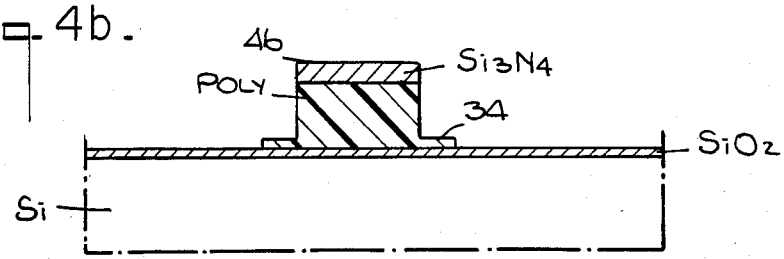
Figure 4C:
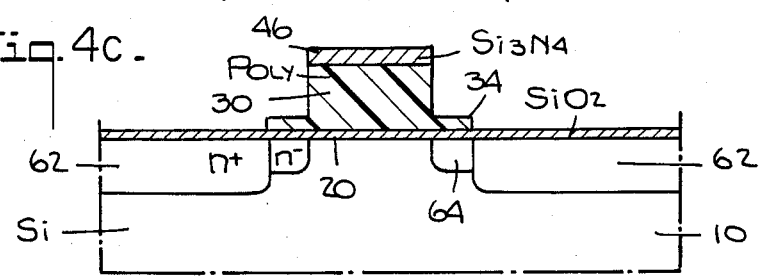
Figure 4D:
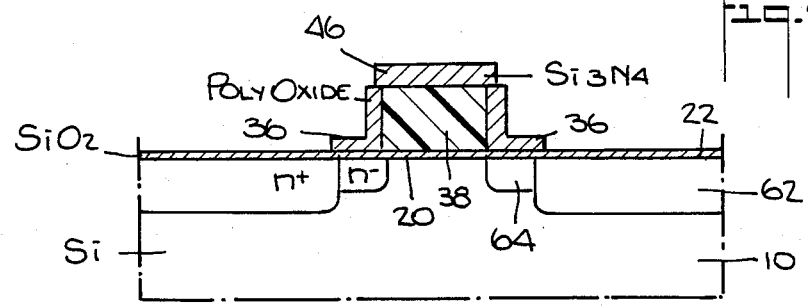
Figure 4E:
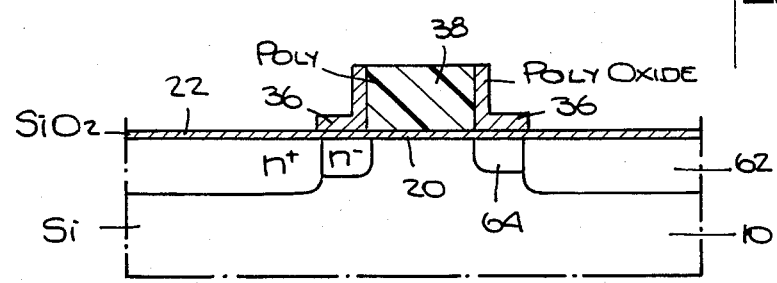
Figure 4F:
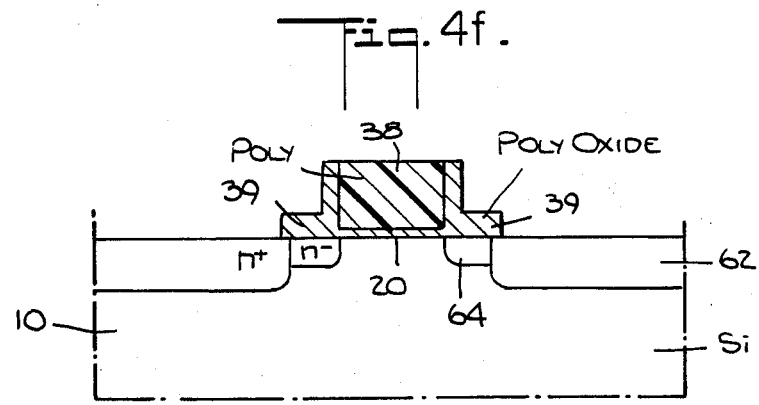
Figure 4G:
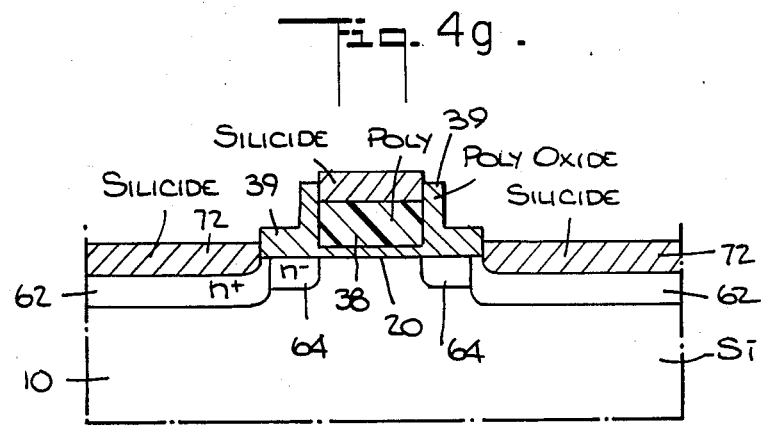
Figure 5A:
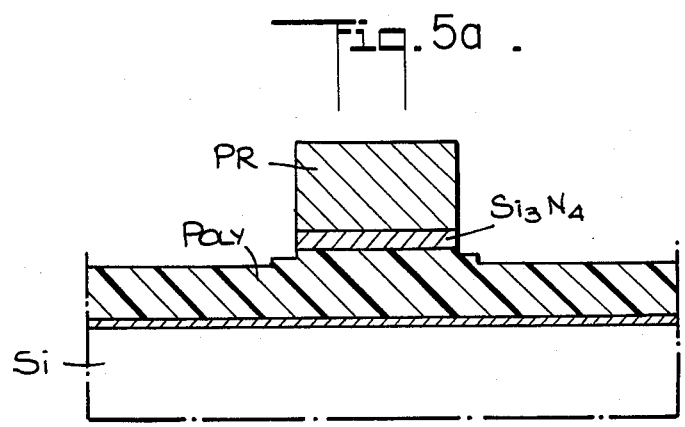
Figure 5B:
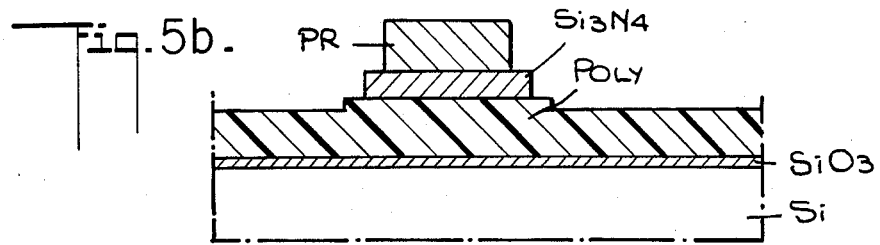
Figure 5C:
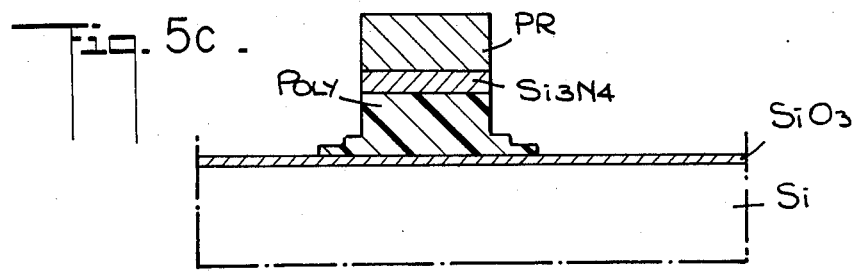
Figure 5D:
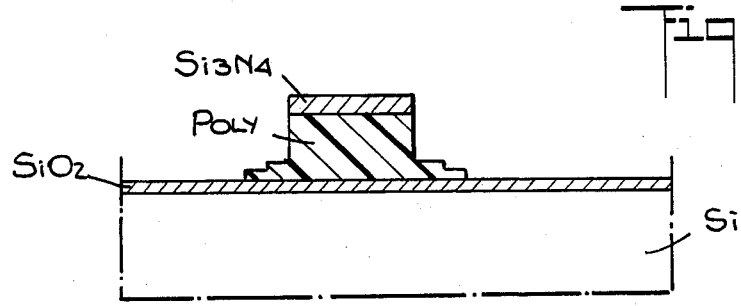
Figure 5E:
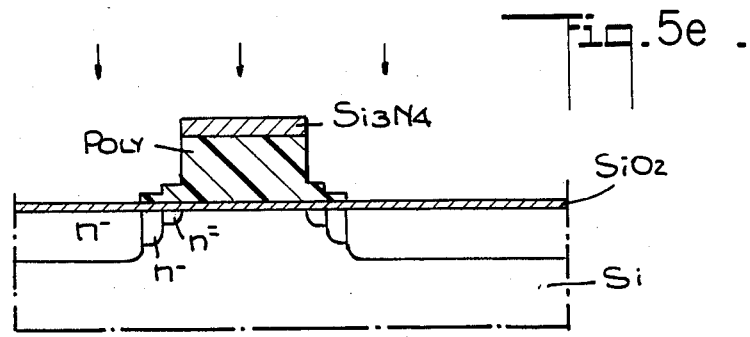
Figure 5F:
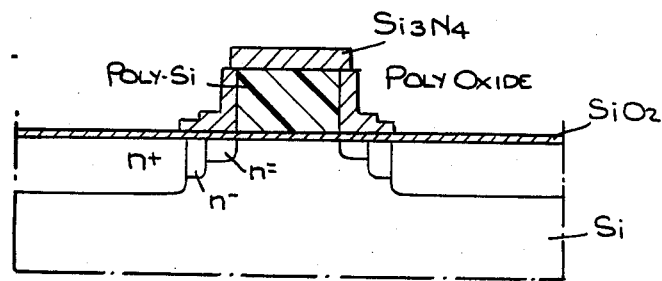
Figure 5G:
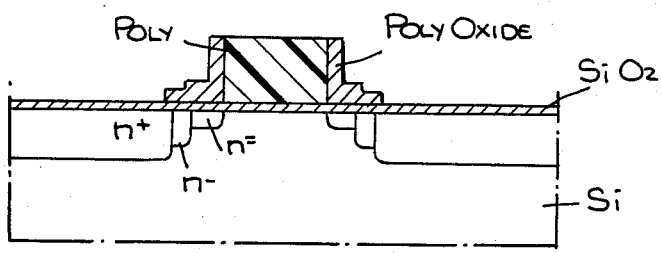
Figure 5H:
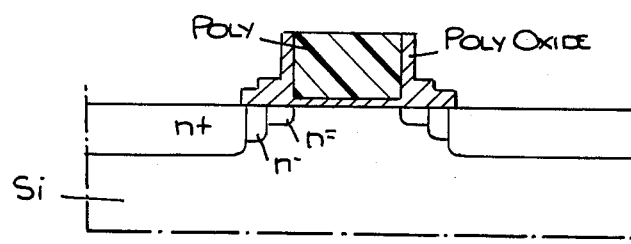
Figure 5I:
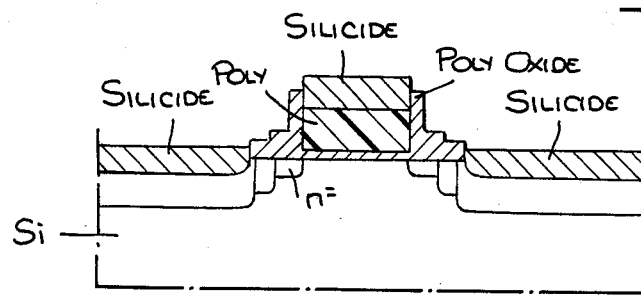
Figure 7A:
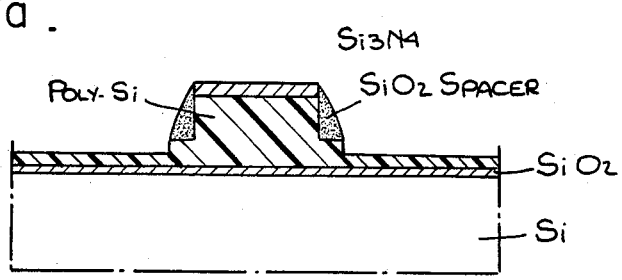
Figure 7B:
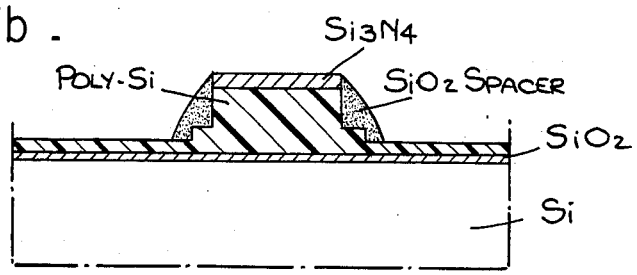
Figure 7C:
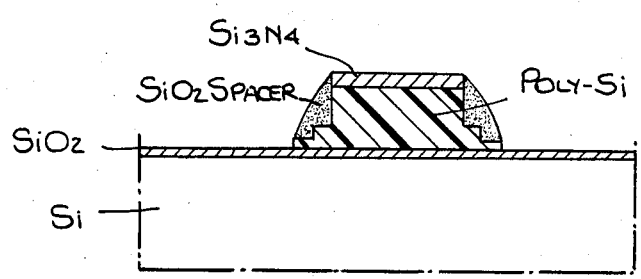
Figure 7D:
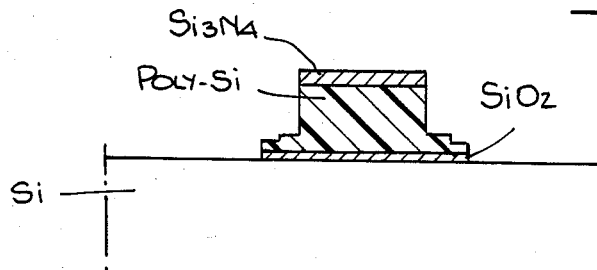

FIGS. 1 through 3 above and B-4 through B-12 which follow show various stages in the fabrication of an LDDFET having two steps in accordance with a second embodiment of the invention.

FIG. B-4 illustrates the structure shown in FIG. 3 after an anisotropic etching process which removes completely the unmasked silicon nitride film and partially the unmasked polysilicon film.

FIG. B-5 illustrates the structure after a second isotropic etching step which further erodes the photoresist masking layer to expose still another portion of the unetched silicon nitride.

FIG. B-6 shows the structure after a second anisotropic etching step. Here the unmasked silicon nitride and the partially etched polysilicon outside the gate region are removed completely.

FIG. B-7 illustrates the structure after the photoresist layer is removed. The ladder polysilicon gate having two steps with the silicon nitride layer is shown.

FIG. B-8 shows the ion implantation of the structure. The unmasked portion of the substrate is heavily doped, while the portions of the substrate under the steps of the polysilicon layer are lightly doped to form two lightly-doped source and drain regions having differing degrees of doping.

FIG. B-9 illustrates the structure after oxidation of the thin polysilicon steps and the sidewall of the polysilicon layer to form polysilicon dioxide spacers.

FIG. B-10 shows the structure remaining after the silicon nitride layer is removed.

FIG. B-11 illustrates the structure after the removal of the silicon dioxide layers from the source/drain regions.

FIG. B-12 illustrates the LDDFET with the salicides formed over the gate and the source/drain regions.

A third embodiment of the invention is shown in FIGS. C-2 through C-5. In this embodiment the structure is initially formed as shown in FIG. 1 and, after the structure shown in FIG. C-5 is formed, the LDDFET with self-aligned silicide is formed following substantially the procedures set forth in FIGS. A-6 to A-10.

FIG. C-2 illustrates the structure after the unmasked silicon nitride is completely removed and the polysilicon layer partially removed by anisotropic etching.

FIG. C-3 shows a silicon substrate having a thin silicon dioxide layer upon which is deposited a polysilicon layer having a thick central portion and thin peripheral portions. Atop the central portion is a silicon nitride layer. Spacers are shown covering the vertical faces of the central portion of the polysilicon layer and the silicon nitride layer and portions of the thin polysilicon layer adjacent to the central portion.

FIG. C-4 shows the structure after the unmasked portion of the polysilicon layer is removed.

FIG. C-5 shows the structure remaining after the spacer silicon dioxide layer is removed. The ladder polysilicon gate having a silicon nitride layer atop the central portion is shown.

FIGS. D-4 through D-7 show a fourth embodiment of the invention. This is a variation on the second embodiment of the invention which is used for forming the two-step LDDFET with self-aligned silicide. In this embodiment, the steps described in connection with the third embodiment are initially followed. These steps include the formation of the structures shown in FIGS. 1, C-2 and C-3.

FIG. D-4 shows the structure after a second anisotropic etching of the polysilicon layer.

FIG. D-5 shows the structure after the chemical vapor deposition of silicon oxide on the sidewalls of the silicon nitride layer and the polysilicon layer.

FIG. D-6 shows the structure after the etching of the thin unmasked polysilicon layer.

FIG. D-7 illustrates the structure after the removal of the silicon dioxide spacer. A two-step ladder polysilicon gate with the silicon nitride layer atop the thick central portion is shown.

FIGS. E-1 through E-6 show the fifth embodiment of the invention. Simply stated, these figures correspond directly to FIGS. 1 to 3 and FIGS. A-4 through A-6, with the exception that there is no silicon nitride layer above the polysilicon layer during processing.

The sixth embodiment of the invention is shown in FIGS. F-1 through F-8. Here a two step LDD is formed. The figures in this embodiment correspond directly with the figures representing the second embodiment of the invention. More specifically, FIGS. F-1 through F-8 correspond to FIGS. 1 through 3 and B-4 through B-8, again with the exception that the silicon nitride layer is not present in the sixth embodiment.

The seventh embodiment of the invention is shown in FIGS. G-1 through G-5. In this embodiment, spacer technology is employed to form a single step LDD. FIGS. G-1 through G-5 correspond directly to FIG. 1 and FIGS. C-2 through C-5 of the third embodiment, with the exception that the silicon nitride layer is replaced by a silicon dioxide layer.

The eighth and final embodiment of the invention is illustrated in FIGS. H-1 through H-7. Here a two step LDD is formed using spacer technology. In this embodiment, the first three figures, H-1 through H-3, correspond directly to those of the seventh embodiment of the invention, namely, G-1 through G-3. FIG. H-4 shows the structure after the second anisotropic etching of the polysilicon layer. The last three figures, H-5 through H-7, correspond directly with FIGS. D-5 through D-7 shown in the fourth embodiment of the invention except the silicon nitride layer in the former is replaced by a silicon dioxide layer.

DETAILED DESCRIPTION OF THE INVENTION

According to the present invention, an improved method is provided to fabricate the lightly doped drain field effect transistor (LDDFET) with or without self-aligned silicide (salicide). This technique finds particular application in the processing of silicon wafers for integrated circuit chips. Accordingly, the invention will be described for this particular application.

Referring now to the drawings, FIG. 1 shows a section through the silicon wafer after the initial processing steps. The silicon wafer, designated by the reference character 10, has grown thereon a thin film of silicon dioxide ($SiO_2$), 20. On top of the $SiO_2$ is a layer of doped polysilicon, 30, which has been doped using in-situ chemical vapor deposition (CVD) or a diffusion process. On top of the polysilicon 30 is a layer of silicon nitride, 40, which is deposited using conventional low pressure chemical vapor deposition (LPCVD) or plasma-enhanced chemical vapor deposition (PECVD). On top of the silicon nitride 40 is a photoresist masking layer, 50, having a polysilicon gate pattern. This pattern is defined using standard photoresist coating, exposure and development processes.

FIG. 2 shows the resulting structure after the unmasked portions of silicon nitride 40 and a part of polysilicon 30 are etched anisotropically. The anisotropic etching can be performed using the reactive-ion etching system, for example, AME-8110 system (trademark of Applied Material Co.). The silicon nitride etching is performed using 60 SCCM (standard cubic centimeters per minute) of $CHF_3$ and 35 SCCM of $O_2$ at a pressure of 40 milli-torr and a power of 600 watts. This gives an etch rate of about $630\pm10$ Angstroms/min. For polysilicon etching, 65 SCCM of Ar and 20 SCCM of $NF_3$, a pressure of 40 milli-torr and a D.C. bias of $-230$ V are preferred, with the etch rate being about $250\pm15$ Angstroms/min. The amount of the polysilicon layer removed is carefully determined, typically 700 Angstroms. The remainder of the unmasked polysilicon layer, designated by the reference character 32, is left on the silicon dioxide and the remainder of the silicon nitride, designated by the reference character 42, is left on the polysilicon. This layer 42 plays the role of an oxidation resistance layer during the subsequent polysilicon oxidation step.

FIG. 3 shows the resulting structure after the photoresist masking layer is isotropically etched. This etch step exposes the desired portion of the etch-resistant silicon nitride layer 42. The isotropic etching can be performed using a dry etching process, for example, by introducing 50 SCCM of $O_2$ gas into AME-8110 system, at a pressure of 100 milli-torr and a power of 300 watts to etch the photoresist at a lateral rate of about $800\pm30$ Angstroms/min. The remaining portion of photoresist masking layer is designated by the reference character 52. The remaining portion of the unetched silicon nitride is designated by the reference character 44.

FIG. A-4 shows the resulting structure after the exposed silicon nitride layer and a portion of polysilicon layer 32 are removed completely by anisotropic etching using a AME-8110 system. As can be seen, there is formed a polysilicon "step," designated by the reference character 34, around the bottom of the polysilicon gate 30, the latter being under the eroded photoresist masking layer 52. The polysilicon step 34 is the remainder of the exposed unetched polysilicon 32 after the first polysilicon anisotropic etching. The length of this step corresponds to the length of lightly-doped regions and is designed to be in the range of 0.25–0.30 micrometer for standard applications. The thickness of polysilicon step 34 is, making reference to FIG. 2, equal to the difference between the thickness of unetched polysilicon gate 30 and the thickness of the partially etched polysilicon 32, i.e., the thickness of the polysilicon removed in the first polysilicon etching procedure. As stated above, the thickness of polysilicon step 34 is, in this example, 700 Angstroms. The remainder of silicon nitride 42, designated by the reference character 46, is left on top of the polysilicon gate 30 after etching.

FIG. A-5 shows the resulting structure after the photoresist masking layer 52 is removed using, for example, a sulfuric acid stripping solution. As can be seen, the polysilicon gate is ladder-shaped, i.e., has the step 34, with silicon nitride on top of it. This is an essential feature in the process for making an LDDFET with salicide.

FIG. A-6 shows the resulting structure after the source/drain region is doped by ion implantation. The portions outside the ladder-shaped polysilicon gate regions are unmasked and therefore the implanting dopants penetrate far into the silicon to form the highly-doped source/drain regions 62. The portion of the silicon under the polysilicon step 34, being incompletely masked by the thin layer of polysilicon, are only partially penetrated by the dopant and form lightly-doped source/drain regions 64. The portion under the thick polysilicon gate region 30 and the silicon nitride layer 46 is completely masked and, therefore, the implanting dopants are prevented from reaching the silicon substrate in the gate region.

The ladder-shaped polysilicon gate formed in accordance with the invention permits the simultaneous formation of the highly-doped source/drain regions and lightly-doped source/drain regions by means of a single heavy dose source/drain ion implantation process. Since the thickness or height of the polysilicon step 34 determines the degree of ion implantation in the lightly doped source/drain region, it must be carefully designed. For example, a 700 Angstrom polysilicon step is chosen for an arsenic dopant, $6 \times 10^{15}$ doses/cm$^2$, 80 kilo electron volts energy, source/drain ion implantation process. The proper thickness of the step may be readily determined by those skilled in the art by considering the particular dopant to be used and the degree of ion implantation desired.

After the LDDFET is fabricated, the salicide process is commenced. Referring now to FIG. A-7, the structure is subjected to oxidation so that the thin polysilicon step 34 is oxidized completely. The layer of the polysilicon dioxide 36 is about twice as thick as the thin polysilicon step 34 from which it was formed. In this example, a 1400 Angstrom polysilicon dioxide layer is obtained by oxidizing the 700 Angstrom polysilicon layer. The silicon dioxide layer, formed at the sidewall of the gate, protects the gate sidewall from shorting to source/drain regions during the salicidation process. In addition, the silicon nitride layer 46 prevents the oxidation of the top of the polysilicon layer 30 because the former is highly oxidation-resistant. The polysilicon gate, after oxidation, is designated by the reference character 38. The silicon dioxide formed over the source/drain regions is designated by the reference character 22. The oxidation process can be performed by exposing the structure to oxygen for 5 min., to a mixture of oxygen and hydrogen chloride for 45 min., and to nitrogen for 15 min. in a furnace at 920° C.

FIG. A-8 shows the resulting structure after the silicon nitride layer 46 is removed. This is accomplished by using a dry etching process, as for example by introducing 60 SCCM of CHF$_3$ and 35 SCCM of O$_2$ into AME-8110 system at a pressure of 40 milli-torr and a power of 600 watts. Under these conditions an etch rate of about 630±10 Angstroms/min. is achieved.

FIG. A-9 shows the resulting structure after the silicon dioxide layers 22 are removed by using, for example, a diluted HF solution. During this step a portion of polysilicon dioxide layer 36, corresponding in thickness with the silicon dioxide layer 22, is also removed. The remainder of the polysilicon dioxide layer is designated by the reference character 39.

FIG. A-10 shows the resulting structure after self-aligned silicide layers are formed. The first step in this process is the deposition of a metal film over the wafer. The silicide is then formed by reacting the metal with the silicon in a selected atmosphere at a selected temperature to anneal the structure. Finally, the unreacted metal is removed by a selective wet etch process that etches metal without attacking silicide or polysilicon dioxide, thereby leaving silicides 72 on the gate, source and drain regions. As an example of the foregoing, TiSi$_2$ (titanium disilicide) is formed at temperatures of about 600°–700° C. The selective etch is accomplished using a mixed solution of one part H$_2$O$_2$, one part NH$_4$OH and five parts H$_2$O. A second anneal after etching is performed at 800° C. See C. Y. Ting et al., "The Use of TiSi$_2$ in a Self-Aligned Silicide Technology," *Electrochemical Society, Proceedings of First International Symposium on VLSI Science and Technology* (1982), pp. 224–231 and C. Y. Ting, "Silicide for Contacts and Interconnects," IEDM 84 (International Electron Device Meeting 1984), Sec. 5.1, pp. 110–113.

The key features of the LDDFET with salicide are now achieved. By performing conventional low temperature oxidation, contact window opening, metallization and passivation processes, the LDDFET with salicide is ready for practical applications.

As a further embodiment of the invention, the incompletely anisotropic polysilicon etching and the isotropic photoresist eroding steps of the process described above can be repeated several times to form a multi-step ladder-shaped polysilicon gate. The technique can be used to form a multi-region lightly-doped field effect transistor with salicide. The several polysilicon steps, each with different thicknesses, allow different amounts of dopants to penetrate, thereby forming lightly-doped regions with a gradation of doping concentrations under each polysilicon step after the ion implantation step is performed. Two-, three-, four- and multi-region, lightly-doped drain field effect transistors can all be readily fabricated by following the teaching of the invention. Such multi-region LDD reduce further the channel hot-electron instability, as has been described in connection with graded/buried LDD structures.

The process for forming a ladder-shaped polysilicon gate having two steps may be readily understood by references to FIGS. 1 through 3 and B-4 through B-12. The first three steps of the process described in FIGS. 1 to 3 are identical to those described above and need not be repeated here. The structure, having been subjected to the first mask erosion step shown in FIG. 3, is, as shown in FIG. B-4, subjected to an anisotropic etching process which completely removes the unmasked silicon nitride film and the partially unmasked polysilicon film. As will be noted, this process results in the formation of a second step in the polysilicon layer.

FIGS. B-5 and B-6 show the structure after the second mask erosion step and the second anisotropic etching step. In this latter step, the newly unmasked silicon nitride is removed and the partially etched polysilicon outside the gate region is completely removed so as to expose the gate SiO₂ layer. FIG. B-7 shows the structure after the photoresist layer is removed in preparation for the ion-implantation step illustrated in FIG. B-8. As is shown in FIG. B-8, n+ source and drain regions are formed under the exposed silicon dioxide layer, wherein n⁻ and n⁻⁻ layers are formed beneath the steps of the polysilicon. It will be understood that, since the first polysilicon step is but a thin layer, it serves to only partially mask the ions from penetrating the semiconductor substrate. In contrast, the second step, representing a somewhat thicker layer, further reduces the ion-implantation in the area adjacent to the gate region. This gradation is particularly effective in minimizing the hot-electron effect.

After the implantation step, as illustrated in FIG. B-9, the structure is subjected to an oxidative environment and the exposed surface of the polysilicon is converted to polysilicon dioxide spacers. Thereafter, as shown in FIGS. B-10 and B-11, the silicon nitride layer and the silicon dioxide layer over the source and drain regions are removed. The salicide layers are then formed over the gate and the source and drain regions as shown in FIG. B-12.

It will be understood that the specific steps described in connection with the first embodiment of the invention may be readily applied to this second embodiment of the invention and, therefore, in order to avoid redundancy, such steps are not described in detail in connection with this embodiment.

The third embodiment of the invention, steps of which are shown in FIGS. C-2 through C-5 of the attached drawings, shows a technique for forming the ladder polysilicon gate without the need of using the isotropic etching of the photoresist mask. This method is comparable to the first embodiment to the extent that the initial steps necessary to form FIG. 1 are followed. However, as shown in FIG. C-2, the structure of FIG. 1 is successively subjected to an anisotropic etching step to remove the unmasked silicon nitride layer 40 and to partially remove the unmasked polysilicon layer 30. In this process, the photoresist layer 50 is then completely removed.

As illustrated in FIG. C-3, the next step is to chemically vapor deposit a silicon oxide layer over the surface of the structure shown in FIG. C-2. Thereafter, using anisotropic etching, preferably reactive ion etching, spacers 82 are formed which cover the vertical surfaces of the silicon nitride and the thick central portion of the polysilicon layer as well as a defined portion of the horizontal surface of the thin polysilicon layer. The sequence of CVD deposition of silicon dioxide followed by reactive ion etching is referred to as spacer technology. This is described in *IEEE*, Vol. ED-29, No. 4, p. 590.

The next step in the process is the removal of the entire unmasked polysilicon layer 31. The residual polysilicon is illustrated in FIG. C-4 and comprises a thick central portion 30 and a thin step 34. This stage of the process is completed by etching the structure to completely remove the spacer 82, thereby forming the structure shown in FIG. C-5. It will be noted that the structure in FIG. C-5 is comparable to that shown in the first embodiment of the invention in FIG. A-6. From this point in the process, the fabrication of the LDDFET with self-aligned silicide is substantially the same as that shown for the first embodiment of the invention.

The fourth embodiment of the invention is a variation on the technique for forming the two-step LDDFET with salicide. The initial steps in this embodiment are similar to the third embodiment of the invention down through the processing steps illustrated in FIG. C-3.

After the silicon dioxide spacer is formed, a second anisotropic etching step is carried out to further reduce the thickness of the polysilicon layer. The resulting structure is illustrated in FIG. D-4. It will be noted that the silicon dioxide spacer and the silicon nitride layer act as a mask in this processing step.

In the next step, a second chemical vapor deposition step takes place, followed by anisotropic etching to form the silicon dioxide spacer shown in FIG. D-5. This step in essence increases the thickness of the silicon dioxide spacer so that it now covers the thin polysilicon layer. Using the same techniques as previously described, the unmasked polysilicon layer is now completely removed, exposing the thin silicon dioxide layer on top of the silicon substrate to form the structure shown in FIG. D-6.

FIG. D-7 shows the two-step ladder polysilicon gate structure after the silicon dioxide spacer and the unmasked thin silicon dioxide layer are removed. Thereafter, the salicide is formed, following substantially the steps set forth in FIGS. B-8 to B-12. The key advantage of the spacer technology described in the third and fourth embodiments of the invention is the controllability of the polysilicon etching. In the photoresist eroding process, shown in the first two embodiments of the invention described above, it is difficult to form a polysilicon step of the desired thickness without leaving a polysilicon residue outside of the gate region. In spacer technology, in contrast, the spacer is formed to mask the polysilicon step after the desired thickness has been achieved. Thereafter, the anisotropic etching can be used to remove the polysilicon outside of the gate region completely while the polysilicon step is protected.

As a further embodiment of the invention, after the ion implantation step of the process (e.g., FIGS. A-6 and B-8) is performed, the silicon nitride layer may be removed. This results in a ladder-gate or a multi-region ladder-gate LDDFET without salicide. Such process can also be used to fabricate n-channel MOSFETs.

In addition, the ion implantation step of the process may be omitted and the invention applied as a spacer formation process. Such process may be used to fabricate NMOS or PMOS with salicide.

The second technique of the invention is shown in the four embodiments illustrated in FIGS. E-1 to H-7. FIG. E-1 shows a section through the silicon wafer after the initial processing steps. The silicon wafer, designated by the reference character 10, has grown thereon a thin film of silicon dioxide (SiO₂), 20. On top of the SiO₂ is a layer of doped polysilicon, 30, which has been doped using in-situ chemical vapor deposition (CVD) or a diffusion process. On top of the polysilicon 30 is a photoresist masking layer, 50, having a polysilicon gate pattern. This pattern is defined using standard photoresist coating, exposure and development processes.

FIG. E-2 shows the resulting structure after the unmasked portions of polysilicon 30 are etched anisotropically. The anisotropic etching can be performed using the reactive-ion etching system as described above. The amount of the polysilicon layer removed is carefully determined, typically 700 Angstroms. The remainder of the unmasked polysilicon layer, designated by the reference character 32, is left on the silicon dioxide.

FIG. E-3 shows the resulting structure after the photoresist masking layer is isotropically etched. This etch step exposes the desired portion of the polysilicon layer 30. The remaining portion of photoresist masking layer is designated by the reference character 52.

FIG. E-4 shows the resulting structure after the exposed portion of polysilicon layer 32 is removed completely by anisotropic etching. There is formed a polysilicon "step" 36 around the bottom of the polysilicon gate 30, the latter being under the eroded photoresist masking layer 52. The polysilicon step 36 is the remainder of the exposed unetched polysilicon 32 after the first polysilicon anisotropic etching.

FIG. E-5 shows the resulting structure after the photoresist masking layer 52 is removed. As can be seen, the polysilicon gate is ladder-shaped, i.e., has the step 36.

FIG. E-6 shows the resulting structure after the source/drain region is doped by ion implantation. The portions outside the ladder-shaped polysilicon gate regions are unmasked and therefore the implanting dopants penetrate far into the silicon to form the highly-doped source/drain regions 62. The portion of the silicon under the polysilicon step 36, being incompletely masked by the thin layer of polysilicon, are only partially penetrated by the dopant and form lightly-doped source/drain regions 64. The portion under the thick polysilicon gate region 30 is completely masked and, therefore, the implanting dopants are prevented from reaching the silicon substrate in the gate region.

The process for forming a ladder-shaped polysilicon gate having two steps according to the second technique of the invention is shown in FIGS. F-1 through F-8. The first three steps of the process shown in FIGS. F-1 to F-3 are identical to those in FIGS. E-1 to E-3 and need not be repeated here. The structure, having been subjected to the first mask erosion step shown in FIG. E-3, is, as shown in FIG. F-4, subjected to an anisotropic etching process which removes the partially unmasked polysilicon film. As will be noted, this process results in the formation of a second step in the polysilicon layer.

FIGS. F-5 and F-6 show the structure after the second mask erosion step and the second anisotropic etching step. In this latter step, the newly unmasked polysilicon is removed and the partially etched polysilicon outside the gate region is completely removed so as to expose the gate SiO$_2$ layer. FIG. F-7 shows the structure after the photoresist layer is removed in preparation for the ion-implantation step illustrated in FIG. F-8. As is shown in FIG. B-8, n+ source and drain regions are formed under the exposed silicon dioxide layer, wherein n− and n−− layers are formed beneath the steps of the polysilicon. It will be understood that, since the first polysilicon step is but a thin layer, it serves to only partially mask the ions from penetrating the semiconductor substrate. In contrast, the second step, representing a somewhat thicker layer, further reduces the ion-implantation in the area adjacent to the gate region. This gradation is particularly effective in minimizing the hot-electron effect.

The seventh embodiment of the invention, steps of which are shown in FIGS. G-1 through G-5 of the attached drawings, shows a technique for forming the ladder polysilicon gate without the need of using the isotropic etching of the photoresist mask. This method is comparable to the first embodiment to the extent that the initial steps necessary to form FIG. 1 are followed, with the exception that a silicon dioxide layer 60 is formed between the polysilicon layer 30 and the photoresist 50. As shown in FIG. G-2 the structure of FIG. 1 is successively subjected to an anisotropic etching step to remove the unmasked silicon dioxide layer 60 and to partially remove the unmasked polysilicon layer 30. In this process, the photoresist layer 50 is then completely removed.

As illustrated in FIG. G-3, the next step is to chemically vapor deposit a silicon oxide layer over the surface of the structure shown in FIG. G-2. Thereafter, using anisotropic etching, preferably reactive ion etching, spacers 82 are formed which cover the vertical surfaces of the silicon dioxide and the thick central portion of the polysilicon layer as well as a defined portion of the horizontal surface of the thin polysilicon layer.

The next step in the process is the removal of the entire unmasked polysilicon layer 31. The residual polysilicon is illustrated in FIG. G-4 and comprises a thick central portion 30 and a thin step 36. This stage of the process is completed by etching the structure to completely remove the spacer 82, thereby forming the structure shown in FIG. G-5. It will be noted that the structure in FIG. G-5 is comparable to that shown in the fifth embodiment of the invention in FIG. E-5. From this point in the process, the fabrication of the LDDFET is substantially the same as that shown for the fifth embodiment of the invention.

The eighth embodiment of the invention is a variation on the technique for forming the two-step LDD. The initial steps in this embodiment, FIGS. H-1 to H-3, are similar to the seventh embodiment of the invention down through the processing steps illustrated in FIG. G-3.

After the silicon dioxide spacer is formed, a second anisotropic etching step is carried out to further reduce the thickness of the polysilicon layer. The resulting structure is illustrated in FIG. H-4. It will be noted that the silicon dioxide spacer and the silicon dioxide layer act as a mask in this processing step.

In the next step, a second chemical vapor deposition step takes place, followed by anisotropic etching to form the silicon dioxide spacer shown in FIG. H-5. This step in essence increases the thickness of the silicon dioxide spacer so that it now covers the thin polysilicon layer. Using the same techniques as previously described, the unmasked polysilicon layer is now completely removed, exposing the thin silicon dioxide layer on top of the silicon substrate to form the structure shown in FIG. H-6.

FIG. H-7 shows the two-step ladder polysilicon gate structure after the silicon dioxide spacer and the unmasked thin silicon dioxide layer are removed. Ion-implantation follows to form the LDDFET structure as described above.

In scaling down MOSFETs, many problems arise. Hot-electron instability and series resistance are two of the main problems. The hot-electron instability problem is eliminated by using the LDD structure, while series resistance is reduced by using salicide interconnections.

In addition to the steps recited above for fabricating the standard NMOS or PMOS, a series of additional process steps is employed. These include defining the isolation region, forming gate dielectrics, defining polysilicon gate regions, ion-implantation of the source and drain regions, low temperature oxide deposition, forming window openings for the contacts, metallization, and passivation. For CMOS integrated circuit fabrication, a well formation step must first be employed and the p+ and n+ source/drain regions formed individually. The foregoing additional steps are well known in the art.

In the description of the embodiments of the invention set forth above, it is assumed that the isolation region (for NMOS and PMOS) or well and isolation regions (for CMOS) have already been formed in accordance with conventional procedures.

It will be understood that only NMOS devices have the hot-electron instability problem; accordingly, the ladder-gate LDDFET with or without salicide would only be used to fabricate n-channel MOSFETs. On the other hand, both NMOS and PMOS devices have series resistance problems, thereby making the use of the spacer formation process with salicides particularly useful.

The foregoing description is for purposes of illustration only. It will be readily understood that many variations thereof, which will not depart from the spirit of the invention, will be apparent to those skilled in the art.

What is claimed is:

1. A process for preparing a structure useful in making field effect transistors which comprises:
   a. defining a gate pattern by means of a photoresist mask on a silicon nitride layer of a laminate comprising a semiconductor substrate having deposited thereon successively a gate oxide layer, a polysilicon layer, and said silicon nitride layer;
   b. completely removing unmasked portions of the silicon nitride layer and partially removing unmasked portions of the polysilicon layer by anisotropically etching said layers;
   c. eroding the photoresist mask by isotropic etching to expose a defined unmasked portion of the silicon nitride layer;
   d. anisotropically etching the unmasked silicon nitride layer completely and the polysilicon layer partially to form a polysilicon layer having a relatively thick central portion and a relatively thin peripheral step and to expose a portion of the gate oxide layer of said laminate adjacent to said relatively thin peripheral step; and
   e. stripping the photoresist mask.

2. A process for preparing a structure useful in making field effect transistors which comprises:
   a. defining a gate pattern by means of a photoresist mask on a silicon nitride layer of a laminate comprising a semiconductor substrate having deposited thereon successively a gate oxide layer, a polysilicon layer, and said silicon nitride layer;
   b. completely removing unmasked portions of the silicon nitride layer and partially removing unmasked portions of the polysilicon layer by anisotropically etching said layers and stripping the photoresist mask;
   c. depositing a CVD SiO$_2$ layer followed by an anisotropic etch to form oxide sidewall spacers;
   d. anisotropically etching the unmasked polysilicon completely to form polysilicon layer having a relatively thick central portion and a relatively thin peripheral step and to expose a portion of the gate oxide layer of said laminate adjacent to said relatively thin peripheral step; and
   e. removing the sidewall spacers.

3. A process as claimed in claim 1 or 2 which comprises the additional steps of:
   f. ion-implanting the resultant structure to form simultaneously heavily doped source/drain regions under said exposed portion of said gate oxide layer and lightly-doped source/drain regions under said peripheral step of said polysilicon layer; and
   g. removing the silicon nitride layer, thereby fabricating a lightly-doped drain field effect transistor.

4. The process of claim 3 wherein the field effect transistor is of the n-channel type.

5. The process of claim 3 wherein the dopant in the ion-implantation process is arsenic or phosphorus.

6. A process as claimed in claim 1 or 2 which comprises the additional steps of:
   f. oxidizing completely the thin peripheral polysilicon step and the sidewalls of the polysilicon central portion;
   g. removing the silicon nitride layer; and
   h. removing from atop the heavily-doped source/drain regions, a gate oxide layer, so as to form a structure having silicon dioxide spacers on the sidewalls of the gate and over the lightly-doped source/drain regions and having exposed source/drain regions,
thereby fabricating a lightly-doped drain field effect transistor.

7. The process of claim 6 wherein the etchant for removing the silicon dioxide is a dilute hydrogen fluoride solution or a buffered oxide etchant.

8. A process as claimed in claim 1 or 2 which comprises the additional steps of:
   f. ion-implanting the resultant structure to form simultaneously heavily doped source/drain regions under said exposed portion of said gate oxide layer and lightly-doped source/drain regions under said peripheral step of said polysilicon layer;
   g. oxidizing completely the thin peripheral polysilicon step and the sidewalls of the polysilicon central portion;
   h. removing the silicon nitride layer so as to expose the top surface of the gate region;
   i. removing the gate oxide layer on the source/drain regions so as to form a structure having polysilicon dioxide spacers on the sidewalls of said gate and having exposed source/drain regions; and
   j. forming self-aligned silicide layers on the exposed source/drain regions and the exposed gate region,
thereby preparing a lightly-doped drain field effect transistor with self-aligned silicide.

9. The process of claim 8 wherein the field effect transistor is the n-channel type.

10. The process of claim 8 wherein the dopant in the ion-implantation process is arsenic or phosphorus.

11. The process of claim 8 wherein the self-aligned silicide layers are formed by depositing a reactive metal, selectively etching the unreacted metal, and annealing the substrate.

12. The process of claim 11 wherein the metal is titanium, molybdenum, platinum, cobalt, nickel, palladium, tungsten, tantalum or niobium.

13. A process for preparing a structure useful in making a two-region lightly-doped drain field effect transistor which comprises:
   a. defining a gate pattern by means of a photoresist mask on a silicon nitride layer of a laminate comprising a semiconductor substrate having deposited thereon successively a gate oxide layer, a polysilicon layer, and said silicon nitride layer;

b. completely removing unmasked portions of the silicon nitride layer and partially removing unmasked portions of the polysilicon layer by anisotropically etching said layers;

c. eroding the photoresist mask by isotropic etching to expose a defined unmasked portion of the silicon nitride layer;

d. anisotropically etching the unmasked silicon nitride layer completely and the unmasked polysilicon layer partially to form a polysilicon layer having a relatively thick central portion and a relatively thin peripheral step;

e. again eroding the photoresist mask by isotropic etching to expose a second defined unmasked portion of the remaining silicon nitride layer;

f. again anisotropically etching the unmasked silicon nitride layer completely and the polysilicon layer partially to form a polysilicon layer having a relatively thick central portion and two concentric peripheral steps, said first step being relatively thin with respect to said central portion and said second step being relatively thin with respect to the first step and to expose a portion of the gate oxide layer of said laminate adjacent to said relatively thin second step; and g. stripping the photoresist mask.

14. A process for preparing a structure useful in making a two-region lightly-doped drain field effect transistor which comprises:

a. defining a gate pattern by means of a photoresist mask on a silicon nitride layer of a laminate comprising a semiconductor substrate having deposited thereon successively a gate oxide layer, a polysilicon layer, and said silicon nitride layer;

b. completely removing unmasked portions of the silicon nitride layer and partially removing unmasked portions of the polysilicon layer by anisotropically etching said layers and stripping the photoresist mask;

c. depositing a CVD SiO$_2$ layer followed by an anisotropic etch to form oxide sidewall spacers;

d. anisotropically etching the unmasked polysilicon layer partially to form a polysilicon layer having a relatively thick central portion and a relatively thin peripheral step;

e. again depositing a CVD SiO$_2$ layer followed by an anisotropic etch to form oxide sidewall spacers;

f. again anisotropically etching unmasked polysilicon layer completely to form a polysilicon layer having a relatively thick central portion and two concentric peripheral steps, said first step being relatively thin with respect to said central portion and said second step being relatively thin with respect to the first step, and to expose a portion of the gate oxide layer of said laminate adjacent to said relatively thin second step; and g. removing the sidewall spacers.

15. A process as claimed in claim 13 or 14 which comprises the additional steps of:

h. ion-implanting the resultant structure to form simultaneously heavily doped source/drain regions under said exposed portion of said gate oxide layer and two-region lightly-doped source/drain regions under said two peripheral steps of said polysilicon layer; and i. removing the silicon nitride layer, thereby fabricating a two-region lightly-doped drain field effect transistor.

16. The process of claim 15 wherein the field effect transistor is of the n-channel type.

17. The process of claim 16 wherein the dopant in the ion-implanting process is arsenic or phosphorus.

18. A process as claimed in claim 13 or 14 which comprises the additional steps of:

h. completely oxidizing said two thin peripheral polysilicon steps and sidewalls of the polysilicon central portion;

i. removing the silicon nitride layer; and j. removing the gate oxide layer on the source/drain regions, so as to form a structure having polysilicon dioxide spacers on the sidewalls of the gate and having exposed source/drain regions.

19. The process of claim 18 wherein the etchant for removing the silicon dioxide is a dilute hydrogen fluoride solution or a buffered oxide etchant.

20. A process as claimed in claim 13 or 14 which comprises the additional steps of:

h. ion-implanting the resultant structure to form simultaneously heavily doped source/drain regions under said exposed portion of said gate oxide layer and two-region lightly-doped source/drain regions under said two peripheral steps of said polysilicon layer;

i. completely oxidizing said two thin peripheral polysilicon steps and the sidewalls of the polysilicon central portions;

j. removing the silicon nitride layer so as to expose the top surface of the gate region;

k. removing the gate oxide layer of the source/drain regions so as to form a structure having polysilicon dioxide spacers on the sidewalls of said gate and having exposed source/drain regions; and l. forming self-aligned silicide layers on the exposed source/drain regions and the exposed gate region, thereby preparing a two-region lightly-doped drain field effect transistor with self-aligned silicide.

21. The process of claim 20 wherein the field effect transistor is of the n-channel type.

22. The process of claim 20 wherein the dopant in the ion-implantation process is arsenic or phosphorus.

23. The process of claim 20 wherein the self-aligned silicide layers are formed by depositing a reactive metal, selectively etching the unreacted metal, and annealing the substrate.

24. The process of claim 23 wherein the metal is titanium, molybdenum, platinum, cobalt, nickel, palladium, tungsten, tantalum or niobium.

25. The process of claim 1, 2, 13 or 14 wherein the silicon nitride is deposited by low pressure chemical vapor deposition or plasma-enhanced chemical vapor deposition.

26. A process for preparing a structure useful in making field effect transistors which comprises:

a. defining a gate pattern by means of a photoresist mask on a polysilicon layer of a laminate comprising a semiconductor substrate having deposited thereon successively a gate oxide layer and said polysilicon layer;

b. partially removing the unmasked portion of the polysilicon layer by anisotropically etching said layer;

c. eroding the photoresist mask by isotropic etching to expose a defined unmasked portion of the polysilicon layer;

d. anisotropically etching the unmasked polysilicon layer completely to form a polysilicon layer having a relatively thick central portion and a relatively thin peripheral step; and e. stripping the photoresist mask.

27. A process for preparing a structure useful in making field effect transistors which comprises:
   a. defining a gate pattern by means of a photoresist mask on a silicon dioxide layer of a laminate comprising a semiconductor substrate having deposited thereon successively a gate oxide layer, a polysilicon layer, and said silicon dioxide layer;
   b. completely removing unmasked portions of the silicon dioxide layer and partially removing unmasked portions of the polysilicon layer by anisotropically etching said layers and stripping the photoresist mask;
   c. depositing a SiO₂ layer followed by an anisotropic etch to form oxide sidewall spacers;
   d. anisotropically etching the unmasked polysilicon completely to form a polysilicon layer having a relatively thick central portion and a relatively thin peripheral step; and
   e. removing the sidewall spacers.

28. A process as claimed in claim 26 or 27 which comprises the additional step of
   f. ion-implanting the resultant structure to form simultaneously heavily doped source/drain regions under said exposed portion of said oxide layer and lightly-doped source/drain regions under said peripheral step of said polysilicon layer,
thereby fabricating a lightly-doped drain field effect transistor.

29. The process of claim 28 wherein the field effect transistor is of the n-channel type.

30. The process of claim 28 wherein the dopant in the ion-implantation process is arsenic or phosphorus.

31. A process for preparing a structure useful in making a two-region lightly-doped drain field effect transistor which comprises:
   a. defining a gate pattern by means of a photoresist mask on a polysilicon layer of a laminate comprising a semiconductor substrate having deposited thereon successively a gate oxide layer and said polysilicon layer;
   b. partially removing the unmasked portion of the polysilicon layer by anisotropically etching said layer;
   c. eroding the photoresist mask by isotropic etching to expose a defined unmasked portion of the polysilicon layer;
   d. anisotropically etching the unmasked polysilicon layer partially to form a polysilicon layer having a relatively thick central portion and a relatively thin peripheral step;
   e. again eroding the photoresist mask by isotropic etching to expose a second defined unmasked portion of the polysilicon layer;
   f. again anisotropically etching the unmasked polysilicon layer completely to form a polysilicon layer having a relatively thick central portion and two concentric peripheral steps, said first step being relatively thin with respect to said central portion and said second step being relatively thin with respect to the first step; and
   g. stripping the photoresist mask.

32. A process for preparing a structure useful in making a two-region lightly-doped drain field effect transistor which comprises:
   a. defining a gate pattern by means of a photoresist mask on a silicon dioxide layer of a laminate comprising a semiconductor substrate having deposited thereon successively a gate oxide layer and a polysilicon layer, and said silicon dioxide layer;
   b. completely removing unmasked portions of the silicon dioxide layer and partially removing unmasked portions of the polysilicon layer by anisotropically etching said layers and then stripping the photoresist mask;
   c. depositing a SiO₂ layer followed by an anisotropic etch to form oxide sidewall spacers;
   d. anisotropically etching the unmasked polysilicon layer partially to form a polysilicon layer having a relatively thick central portion and a relatively thin peripheral step;
   e. again depositing a SiO₂ layer followed by an anisotropic etch to form oxide sidewall spacers;
   f. again anisotropically etching the unmasked polysilicon completely to form a polysilicon layer having a relatively thick central portion and two concentric peripheral steps, said first step being relatively thin with respect to said central portion and said second step being relatively thin with respect to the first step; and
   g. removing the sidewall spacers.

33. A process as claimed in claim 31 or 32 which comprises the additional step of
   h. ion-implanting the resultant structure to form simultaneously heavily doped source/drain regions under said exposed portion of said gate oxide layer and two-region lightly-doped source/drain regions under said two peripheral steps of said polysilicon layer, thereby fabricating a two-region lightly-doped drain field effect transistor.

34. The process of claim 33 wherein the field effect transistor is of the n-channel type.

35. The process of claim 33 wherein the dopant in the ion-implantation process is arsenic or phosphorus.

36. The process of claim 1, 2, 13, 14, 26, 27, 31, or 32 wherein the semiconductor substrate is a silicon substrate.

37. The process of claim 1, 2, 13, 14, 26, 27, 31 or 32 wherein the isotropic and anisotropic etching steps are performed by dry etching.

38. The process of claim 1, 2, 13, 14, 26, 27, 31 or 32 wherein the polysilicon is doped using an in-situ doping or a diffusion process.

* * * * *

UNITED STATES PATENT AND TRADEMARK OFFICE
CERTIFICATE OF CORRECTION

PATENT NO. : 4,818,715                    Sheet 1 of 5

DATED : Apr. 4, 1989

INVENTOR(S) : Fung-Ching Chao

It is certified that error appears in the above-identified patent and that said Letters Patent is hereby corrected as shown below:

```
Col. 3, line 56: cancel "A-10" and substitute --4g--.

Col. 4, line 4: cancel "A-4" and substitute --4a--;
line 7: cancel "A-5" and substitute --4b--;
line 10: cancel "A-6" and substitute --4c--;
line 12: cancel "A-7" and substitute --4d--;
line 15: cancel "A-8" and substitute --4e--;
line 17: cancel "A-9" and substitute --4f--;
line 19: cancel "A-10" and substitute --4g--;
line 21: cancel "B-4 through B-12" and substitute
--5a through 5i--;
line 25: cancel "B-4" and substitute --5a--;
line 29: cancel "B-5" and substitute --5b--;
line 33: cancel "B-6" and substitute --5c--;
line 37: cancel "B-7" and substitute --5d--;
line 40: cancel "B-8" and substitute --5e--;
line 46: cancel "B-9" and substitute --5f--;
line 49: cancel "B-10" and substitute --5g--;
line 51: cancel "B-11" and substitute --5h--;
line 54: cancel "B-12" and substitute --5i--;
line 57: cancel "C-2 through C-5" and substitute
--6a through 6d--;
line 59: cancel "C-5" and substitute --6d--;
line 61: cancel "A-6 to A-10" and substitute
--4c to 4g--;
line 62: cancel "C-2" and substitute --6a--;
line 65: cancel "C-3" and substitute --6b--.
```

UNITED STATES PATENT AND TRADEMARK OFFICE
CERTIFICATE OF CORRECTION

PATENT NO. : 4,818,715

DATED : Apr. 4, 1989

INVENTOR(S) : Fung-Ching Chao

Figure 11A:
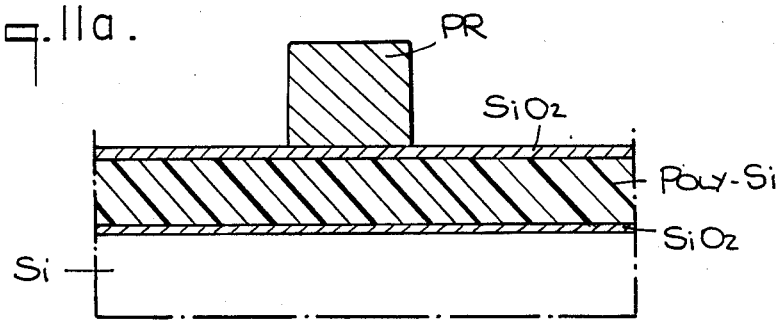
Figure 11B:
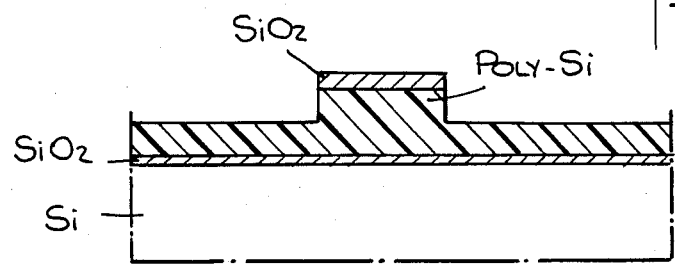
Figure 11C:
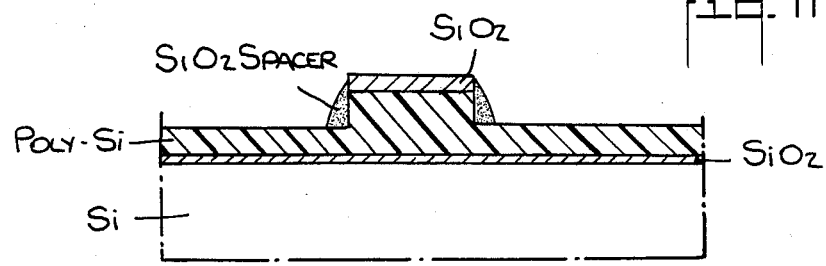
Figure 11D:
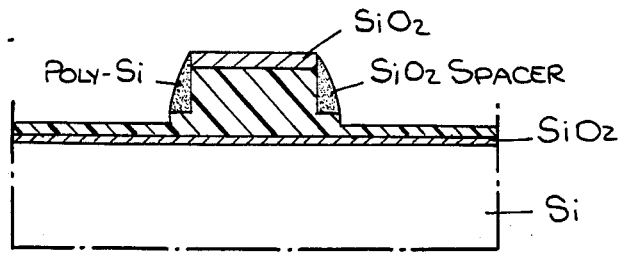
Figure 11E:
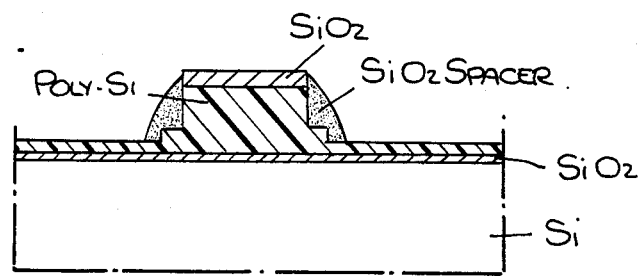
Figure 11F:
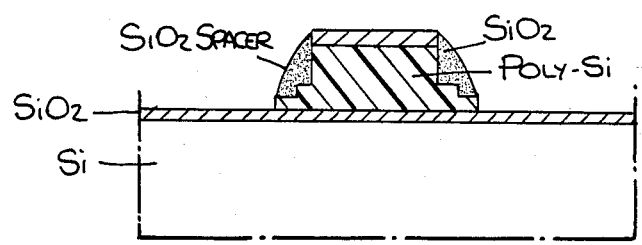
Figure 11G:
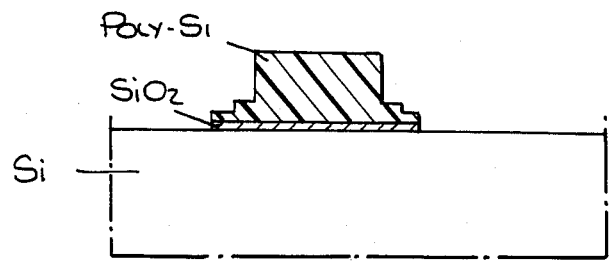

It is certified that error appears in the above-identified patent and that said Letters Patent is hereby corrected as shown below:

```
Col. 5, line 5: cancel "C-4" and substitute --6c--;
line 7: cancel "C-5" and substitute --6d--;
line 11: cancel "D-4 through D-7" and substitute
--7a through 7d--;
line 18: cancel "C-2 and C-3" and substitute
--6a and 6b--;
line 19: cancel "D-4" and substitute --7a--;
line 21: cancel "D-5" and substitute --7b--;
line 24: cancel "D-6" and substitute --7c--;
line 26: cancel "D-7" and substitute --7d--;
line 30: cancel "E-1 through E-6" and substitute
--8a through 8f--;
line 32: cancel "A-4 through A-6" and substitute
--4a through 4c--;
lines 36 and 39-40: cancel "F-1 through F-8" and
substitute --9a through 9h--;
line 40-41: cancel "B-4 through B-8" and substitute
--5a through 5e--;
lines 44 and 46: cancel "G-1 through G-5" and substitute
--10a through 10e--;
line 47: cancel "C-2 through C-5" and substitute
--6a through 6d--;
line 51: cancel "H-1 through H-7" and substitute
--11a through 11g--;
line 53: cancel "H-1 through H-3" and substitute
--11a through 11c--;
line 55: cancel "G-1 through G-3. Fig H-4" and
substitute --10a through 10c. FIG 11d--;
line 57: cancel "H-5" and substitute --11e--;
line 58: cancel "H-7" and substitute --11g--;
lines 58-59: cancel "D-5 through D-7" and substitute
--7b through 7d--.
```

UNITED STATES PATENT AND TRADEMARK OFFICE
CERTIFICATE OF CORRECTION

PATENT NO. : 4,818,715  Sheet 3 of 5

DATED : Apr. 4, 1989

INVENTOR(S) : Fung-Ching Chao

It is certified that error appears in the above-identified patent and that said Letters Patent is hereby corrected as shown below:

```
Col. 6, line 54: cancel "A-4" and substitute --4a--.

Col. 7, line 8: cancel "A-5" and substitute --4b--;
line 15: cancel "A-6" and substitute --4c--;
line 45: cancel "A-7" and substitute --4d--;
line 65: cancel "A-8" and substitute --4e--.

Col. 8, line 4: cancel "A-9" and substitute --4f--;
line 11: cancel "A-10" and substitute --4g--;
line 56: cancel "B-4 through B-12" and substitute
--5a through 5i--;
line 61: cancel "B-4" and substitute --5a--;
line 66: cancel "B-5 and B-6" and substitute
--5b and 5c--.

Col. 9, line 3: cancel "B-7" and substitute --5d--;
line 6: cancel "B-8" (both occurrences) and
substitute --5e--;
line 17: cancel "B-9" and substitute --5f--;
line 21: cancel "B-10 and B-11" and substitute
--5g and 5h--;
line 25: cancel "B-12" and substitute --5i--;
line 33: cancel "C-2 through C-5" and substitute
--6a through 6d--;
line 39: cancel "C-2" and substitute --6a--;
line 46: cancel "C-3" and substitute --6b--;
line 48: cancel "C-2" and substitute --6a--;
line 60: cancel "C-4" and substitute --6c--;
lines 64 and 65: cancel "C-5" and substitute --6d--;
line 66: cancel "A-6" and substitute --4c--.
```

UNITED STATES PATENT AND TRADEMARK OFFICE
CERTIFICATE OF CORRECTION

PATENT NO. : 4,818,715

DATED : Apr. 4, 1989

INVENTOR(S) : Fung-Ching Chao

Figure 8A:
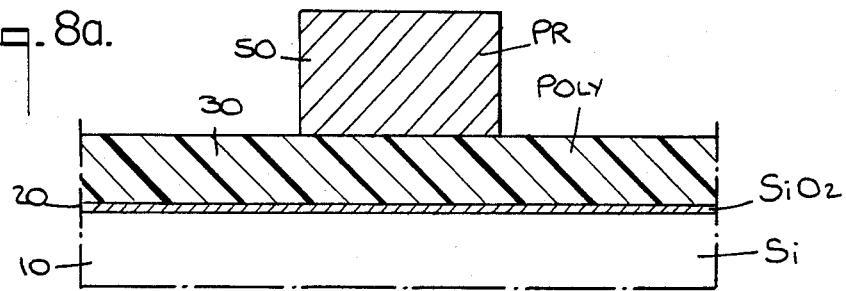
Figure 8B:
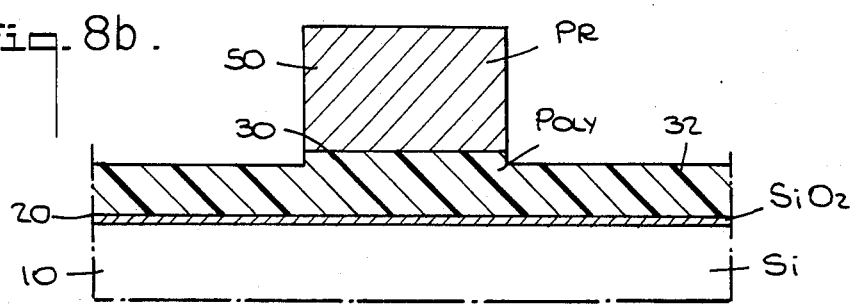
Figure 8C:
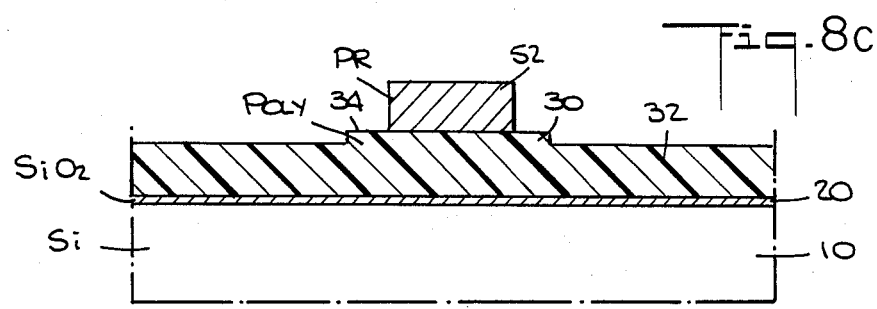
Figure 8D:
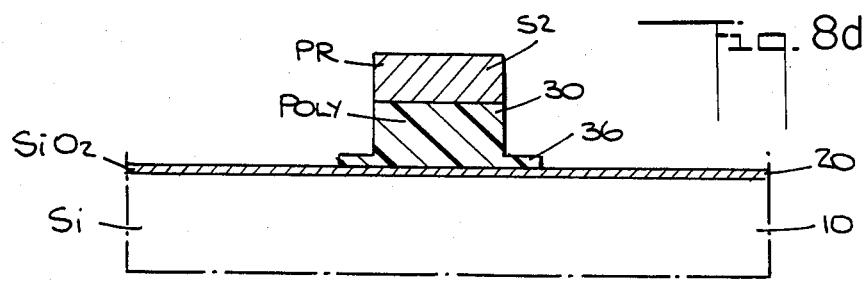
Figure 8E:
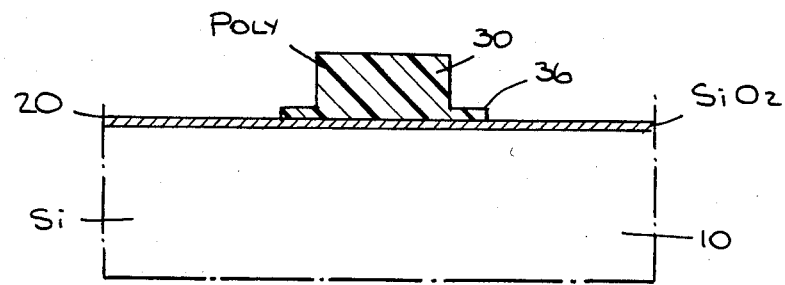
Figure 8F:
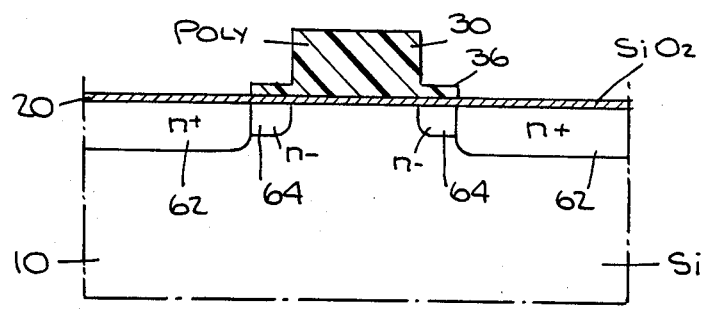
Figure 9A:
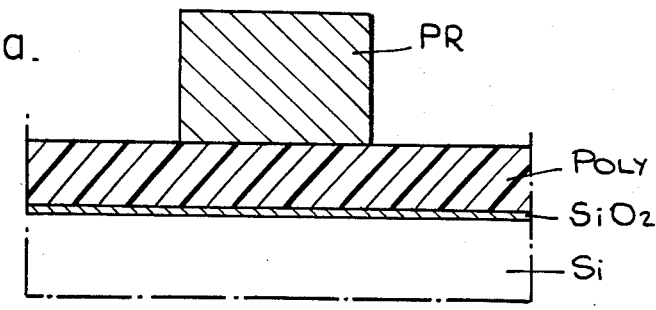
Figure 9B:
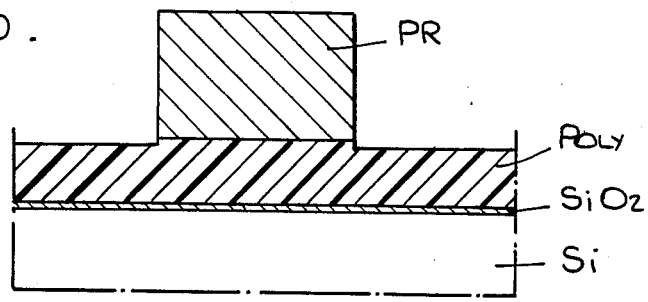
Figure 9C:
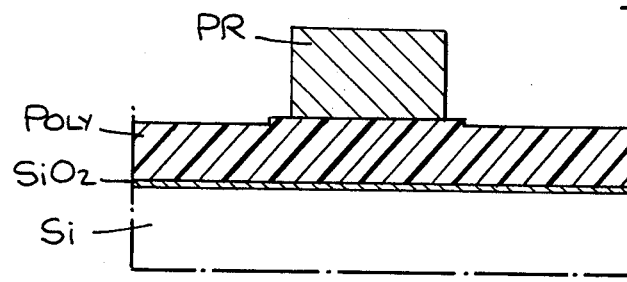
Figure 9D:
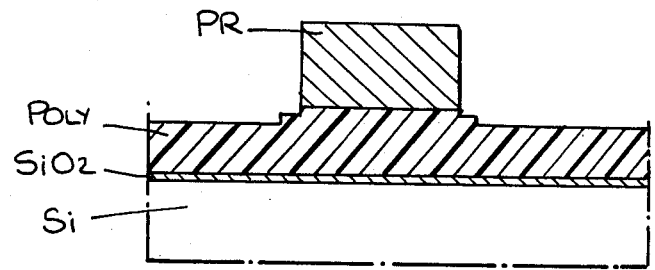
Figure 9E:
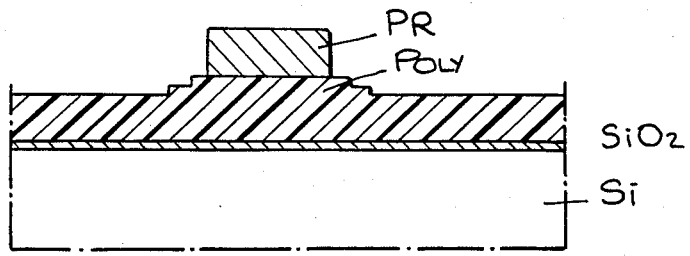
Figure 9F:
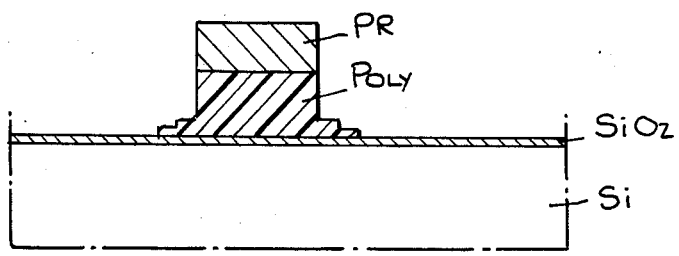
Figure 9G:
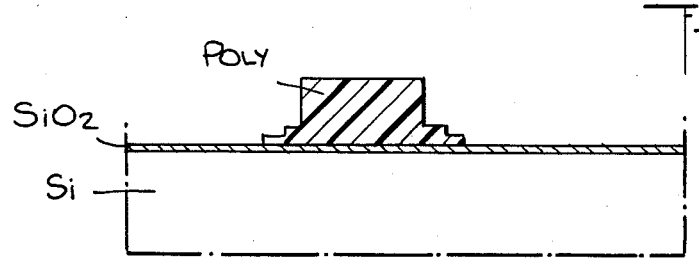
Figure 9H:
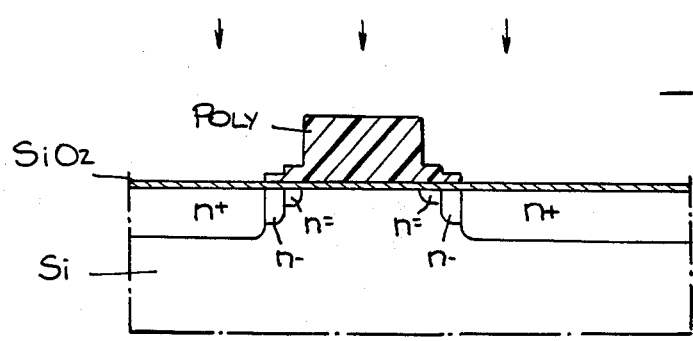
Figure 10E:
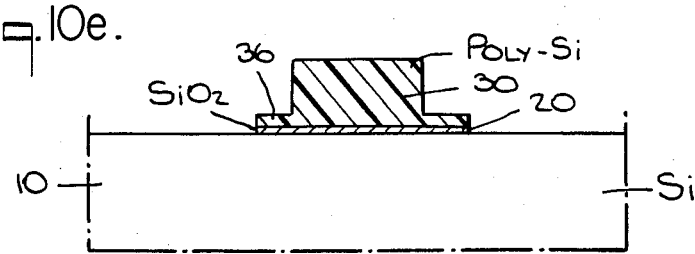

It is certified that error appears in the above-identified patent and that said Letters Patent is hereby corrected as shown below:

```
Col. 10, line 7: cancel "C-3" and substitute --6b--;
line 11: cancel "D-4" and substitute--7a--;
line 16: cancel "D-5" and substitute --7b--;
line 23: cancel "D-6" and substitute --7c--;
line 24: cancel "D-7" and substitute --7d--;
line 28: cancel "B-8 to B-12" and substitute
--5e to 5i--;
lines 43-44: cancel "A-6 and B-8" and substitute
--4c and 5e--;
lines 53-54: cancel "E-1 to H-7. FIG. E-1" and
substitute --8a to 11g. FIG. 8a--;
line 64: cancel "E-2" and substitute --8b--.

Col. 11, line 4: cancel "E-3" and substitute --8c--;
line 9: cancel "E-4" and substitute --8d--;
line 17: cancel "E-5" and substitute --8e--;
line 20: cancel "E-6" and substitute --8f--;
lines 35-36: cancel "F-1 through F-8" and substitute
--9a through 9h--;
line 37: cancel "F-1 to F-3" and substitute --9a to
9c--; cancel "E-1 to E-3" and substitute --8a to 8c--;
line 40: cancel "E-3" and substitute --8c--;
cancel "F-4" and substitute --9d--;
line 45: cancel "F-5 and F-6" and substitute
--9e and 9f--;
line 50: cancel "F-7" and substitute --9g--;
line 53: cancel "F-8" and substitute --9h--; cancel
"B-8" and substitute --5e--;
line 65: cancel "G-1 through G-5" and substitute
--10a through 10e--.
```

UNITED STATES PATENT AND TRADEMARK OFFICE
CERTIFICATE OF CORRECTION

PATENT NO. : 4,818,715

DATED : Apr. 4, 1989

INVENTOR(S) : Fung-Ching Chao

It is certified that error appears in the above-identified patent and that said Letters Patent is hereby corrected as shown below:

```
Col. 12, line 5: cancel "G-2" and substitute --10b--;
line 11: cancel "G-3" and substitute --10c--;
line 13: cancel "G-2" and substitute --10b--;
line 21: cancel "G-4" and substitute --10d--;
lines 25 and 26: cancel "G-5" and substitute --10e--;
line 27: cancel "E-5" and substitute --8e--;
line 33: cancel "H-1 to H-3" and substitute
--11a to 11c--;
line 36: cancel "G-3" and substitute --10c--;
line 40: cancel "H-4" and substitute --11d--;
line 45: cancel "H-5" and substitute --11e--;
line 52: cancel "H-6" and substitute --11f--;
line 53: cancel "H-7" and substitute --11g--.
```

Signed and Sealed this

Thirtieth Day of October, 1990

Attest:

HARRY F. MANBECK, JR.

*Attesting Officer*　　　*Commissioner of Patents and Trademarks*